US009521791B2

(12) United States Patent
Wu

(10) Patent No.: US 9,521,791 B2
(45) Date of Patent: Dec. 13, 2016

(54) ASSEMBLY EQUIPMENT AND ASSEMBLY METHOD THEREOF

(71) Applicant: BOE TECHNOLOGY GROUP CO., LTD., Beijing (CN)

(72) Inventor: Zhongbao Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/095,290

(22) Filed: Apr. 11, 2016

(65) Prior Publication Data

US 2016/0324042 A1 Nov. 3, 2016

(30) Foreign Application Priority Data

Apr. 29, 2015 (CN) .......................... 2015 1 0211955

(51) Int. Cl.
*H05K 13/00* (2006.01)
*H05K 13/04* (2006.01)

(52) U.S. Cl.
CPC .......... *H05K 13/00* (2013.01); *H05K 13/0015* (2013.01); *H05K 13/04* (2013.01); *H05K 13/0408* (2013.01)

(58) Field of Classification Search
CPC .... H05K 13/00; H05K 13/0015; H05K 13/04; H05K 13/0408
See application file for complete search history.

(56) References Cited

U.S. PATENT DOCUMENTS

2016/0139450 A1* 5/2016 Lei .................... G02F 1/133308
349/58

* cited by examiner

*Primary Examiner* — Anne Hines
*Assistant Examiner* — Jose M Diaz
(74) *Attorney, Agent, or Firm* — Nath, Goldberg & Meyer; Joshua B. Goldberg

(57) ABSTRACT

The present invention provides an assembly equipment and an assembly method thereof. The assembly equipment is used for assembling a flexible screen with a curved backplane and includes a supporting part used for supporting and fixing the curved backplane and a holding part used for holding the flexible screen and assembling the flexible screen with the curved backplane in a fit manner. The assembly equipment is provided with the supporting part and the holding part to stably fix the curved backplane and assemble the flexible screen with the curved backplane in a fit manner quickly and accurately, thereby realizing high-efficiency assembly of the flexible screen and the curved backplane, and meanwhile realizing a high yield of display panels formed by assembling the flexible screen and the curved backplane.

13 Claims, 4 Drawing Sheets

ASSEMBLY EQUIPMENT AND ASSEMBLY METHOD THEREOF

FIELD OF THE INVENTION

The present invention relates to the field of display technology, and in particular to an assembly equipment and an assembly method thereof.

BACKGROUND OF THE INVENTION

In the installation process of display devices, high efficiency, high yield and the like are important indexes supporting enterprise profits. The installation of traditional display devices is mostly accomplished by manpower or manpower and simple auxiliary tools.

With the development of display devices, curved display devices are increasingly popular with people. Assembly of the curved display devices proposes new challenges for the traditional assembly manners, and assembly of the curved display devices proposes higher requirements on fixing stability and screen covering accuracy, such that traditional assembly equipment and assembly methods cannot meet the assembly requirements of the curved display devices, resulting in relatively low assembly efficiency of the curved display devices, and meanwhile, the yield of the curved display devices assembled in the traditional assembly manners is relatively low.

SUMMARY OF THE INVENTION

In view of the above technical problems in the prior art, the present invention provides an assembly equipment and an assembly method thereof. The assembly equipment can stably fix a curved backplane and assemble a flexible screen with the curved backplane in a fit manner quickly and accurately, thereby realizing high-efficiency assembly of the flexible screen and the curved backplane, and meanwhile realizing a high yield of display panels formed by assembling the flexible screen and the curved backplane.

According to a first aspect of the present invention, there is provided an assembly equipment for assembling a flexible screen with a curved backplane, including:

a supporting part used for supporting and fixing the curved backplane; and a holding part used for holding the flexible screen and assembling the flexible screen with the curved backplane in a fit manner.

According to a second aspect of the present invention, there is provided the assembly equipment according to the first aspect, wherein the supporting part includes a supporting platform and a plurality of limiting columns which are movably arranged on the supporting platform, the plurality of limiting columns are arranged along edges of the curved backplane, and tops of the limiting columns are configured to contact the curved backplane.

According to a third aspect of the present invention, there is provided the assembly equipment according to the second aspect, wherein the curved backplane includes an edge end face, an upper surface fit to the flexible screen and a lower surface back-to-back with the upper surface, and the lower surface and the edge end face are in contact with the tops of the limiting columns; and the top of the limiting column is a L-shaped step, a step surface of the L-shaped step is adapted and fit to a corresponding region of the lower surface, and a side face adjacent to the step surface of the L-shaped step is configured to contact the edge end face.

According to a fourth aspect of the present invention, there is provided the assembly equipment according to the second aspect, wherein the curved backplane includes an edge end face, an upper surface fit to the flexible screen and a lower surface back-to-back with the upper surface, and the lower surface and the edge end face are in contact with the tops of the limiting columns;

the top of the limiting column is a L-shaped step, a supporting ball capable of rotating 360° is embedded on a step surface of the L-shaped step, an exposed top of the supporting ball is higher than the step surface, and the supporting ball is configured to contact a corresponding point on the lower surface; a side face adjacent to the step surface of the L-shaped step is configured to contact the edge end face; and a unidirectional elastic mechanism is arranged below the supporting ball, and the unidirectional elastic mechanism enables the supporting ball to approach or depart from the supporting platform along a direction perpendicular to the supporting platform.

According to a fifth aspect of the present invention, there is provided the assembly equipment according to the second aspect, wherein the supporting part further includes a light source; on one side along a width direction of the curved backplane of the supporting platform, the light source is arranged on a central position along a length direction of the curved backplane of the supporting platform; and the light source emits light, a propagation direction of which is perpendicular to the supporting platform.

According to a sixth aspect of the present invention, there is provided the assembly equipment according to the second aspect, wherein multiple rows of first holes are arranged on the supporting platform along a direction parallel to the width direction of the curved backplane, the multiple rows of first holes are spaced from each other, and the first holes are used for fixing the limiting columns supporting a width side of the curved backplane; and multiple rows of second holes are arranged on the supporting platform along a direction parallel to the length direction of the curved backplane, the multiple rows of second holes are spaced from each other, and the second holes are used for fixing the limiting columns supporting a length side of the curved backplane.

According to a seventh aspect of the present invention, there is provided the assembly equipment according to the sixth aspect, wherein each row of the first holes includes one or more first strip-shaped holes, and a length direction of the first strip-shaped hole is parallel to the width direction of the curved backplane; and each row of the second holes includes one or more second strip-shaped holes, and a length direction of the second strip-shaped hole is parallel to the length direction of the curved backplane.

According to an eighth aspect of the present invention, there is provided the assembly equipment according to the fifth aspect, wherein the holding part includes an expansion link, a photosensitive element arranged on the expansion link, a plane frame connected to an end part of the expansion link and a plurality of absorption elements arranged on the plane frame; and the plurality of absorption elements are located on one side facing the supporting platform of the plane frame for adsorbing the flexible screen; the photosensitive element is arranged on one side facing the supporting platform of the expansion link; and the expansion link is capable of driving the plane frame to move along the length direction and the width direction of the curved backplane and along the direction perpendicular to the supporting platform, to enable the photosensitive element to receive the light emitted by the light source.

According to a ninth aspect of the present invention, there is provided the assembly equipment according to the eighth aspect, wherein three rows of the absorption elements are arranged on the plane frame, the three rows of the absorption elements are parallel to and spaced from each other, the absorption elements in the middle row are used for absorbing a center line of the flexible screen along the width direction thereof, and two rows of the absorption elements on both sides are used for absorbing two opposite edges of the flexible screen along the width direction thereof.

According to a tenth aspect of the present invention, there is provided the assembly equipment according to the ninth aspect, wherein each row of the absorption elements includes a plurality of absorption elements, and the plurality of absorption elements are arranged at equal intervals.

According to an eleventh aspect of the present invention, there is provided the assembly equipment according to the tenth aspect, wherein each one of the two rows of the absorption elements on both sides includes a suction cup and a connector, the suction cup is connected with one end of the connector, and the other end of the connector is connected with the plane frame;

each one of the absorption elements in the middle row includes a suction cup, a telescopic cylinder and a connector, the telescopic cylinder is connected between the suction cup and the connector, and the connector is connected with the plane frame; and the suction cup is used for adsorbing the flexible screen; and the telescopic cylinder is capable of making telescopic movement under an action of a gas source to change the flexible screen from a planar state into a curved surface state.

According to a twelfth aspect of the present invention, there is provided an assembly method for assembling the above assembly equipment, including:

fixing the curved backplane on the supporting part; and
holding the flexible screen by the holding part, and assembling the flexible screen with the curved backplane in a fit manner.

According to a thirteenth aspect of the present invention, there is provided the method according to the twelfth aspect, specifically including:

adjusting positions of the limiting columns on the supporting platform according to the size of the curved backplane;

placing the curved backplane on the limiting columns;
adsorbing the flexible screen in the planar state with the adsorption elements in the holding part, moving the expansion link in the holding part to adjust a relative position of the flexible screen with respect to the curved backplane, until the photosensitive element on the expansion link receives the light emitted by the light source on the supporting platform;

expanding and contracting the telescopic cylinders of the adsorption elements in the middle row to change the flexible screen from the planar state into the curved surface state, and adapting the flexible screen in the curved surface state to the shape of the curved backplane; and driving the flexible screen with the expansion link to move towards the curved backplane along the direction perpendicular to the supporting platform, until the flexible screen is fit to the curved backplane.

In the assembly equipment according to the first aspect and the assembly methods according to the twelfth aspect to the thirteenth aspect, the supporting part and the holding part are arranged to stably fix the curved backplane and assemble the flexible screen with the curved backplane in a fit manner quickly and accurately, thereby realizing high-efficiency assembly of the flexible screen and the curved backplane, and meanwhile realizing a high yield of display panels formed by assembling the flexible screen and the curved backplane.

In the assembly equipments according to the second aspect to the third aspect, the entire curved backplane can be stably supported and fixed.

In the assembly equipment according to the fourth aspect, an influence of the limiting columns on the curvature of the curved backplane can be reduced, thereby guaranteeing that the flexible screen can be accurately fit to and assembled with the curved backplane.

In the assembly equipments according to the fifth aspect and the eighth aspect, the flexible screen and the curved backplane can be located at accurately aligned positions in the assembly process, so that the yield of the assembled display panel is guaranteed.

In the assembly equipments according to the sixth aspect to the seventh aspect, the assembly range of the assembly equipment is expanded, and the assembly efficiency of the assembly equipment is greatly improved.

In the assembly equipments according to the ninth aspect to the eleventh aspect, the flexible screen can be uniformly stressed when being bent, to ensure that the flexible screen can be bent to a shape matched with that of the curved backplane, and then the flexible screen and the curved backplane can be fit and assembled together quickly and accurately.

REFERENCE SIGNS 1 supporting part; 11 supporting platform; 111 first hole; 112 second hole; 12 limiting column; 121 step surface; 122 side face; 123 supporting ball; 13 light source; 2 holding part; 21 expansion link; 22 photosensitive element; 23 plane frame; 24 absorption element; 241 suction cup; 242 connector; 243 telescopic cylinder; 3 curved backplane; 31 edge end face; 32 upper surface; 33 lower surface; 4 flexible screen.

DETAILED DESCRIPTION OF THE EMBODIMENTS

In order that those skilled in the art can better understand the present invention, exemplary embodiments of the assembly equipment and the assembly method thereof according to the present invention will be illustrated below in detail in conjunction with the accompany drawings and specific embodiments.

First Embodiment

Figure 1:
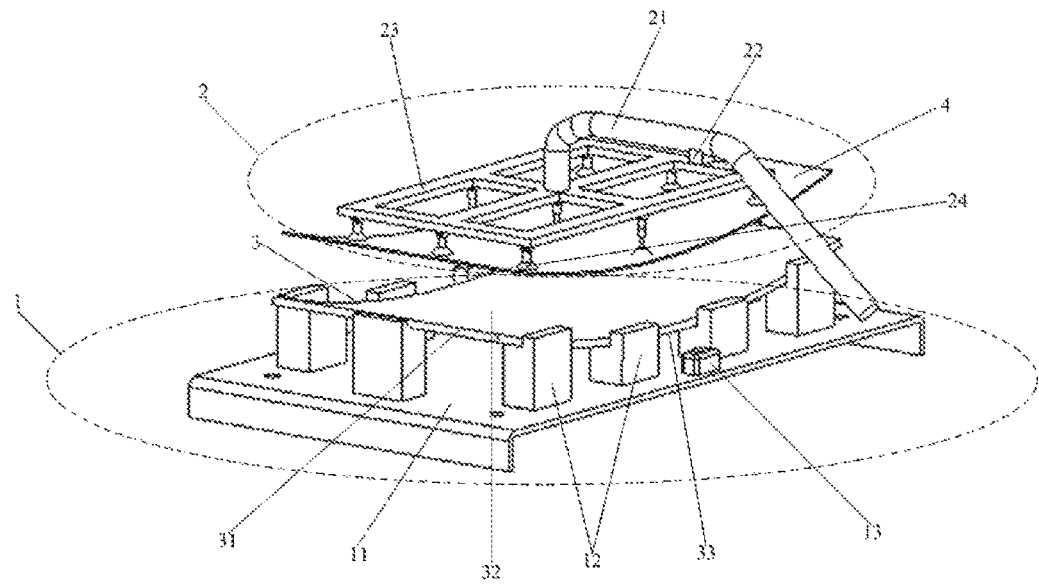
FIG. 1 is an assembly structure diagram of an assembly equipment according to the first embodiment of the present invention.
Figure 2:
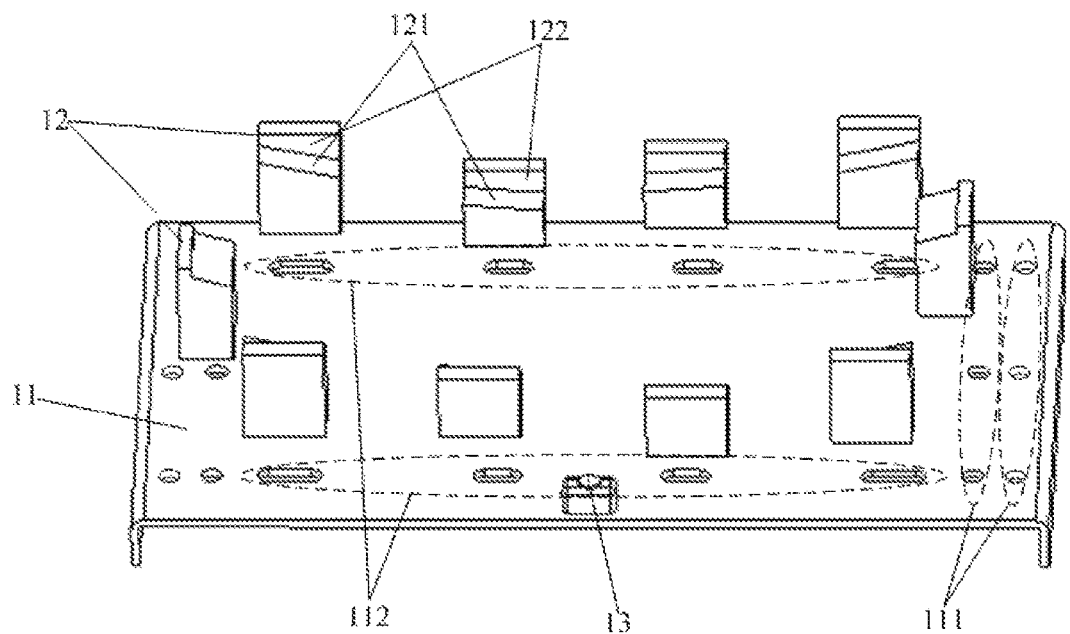
FIG. 2 is a schematic structure diagram of the supporting part in FIG. 1.

As shown in FIGS. 1 and 2, an assembly equipment used for assembling a flexible screen 4 with a curved backplane 3 includes a supporting part 1 and a holding part 2, the supporting part 1 is used for supporting and fixing the curved backplane 3, and the holding part 2 is used for holding the flexible screen 4 and assembling the flexible screen 4 with the curved backplane 3 in a fit manner.

The supporting part 1 and the holding part 2 are arranged to stably fix the curved backplane 3 and assemble the flexible screen 4 with the curved backplane 3 in a fit manner quickly and accurately, thereby achieving high-efficiency assembly of the flexible screen 4 and the curved backplane 3, and meanwhile realizing a high yield of display panels formed by assembling the flexible screen 4 and the curved backplane 3.

In the embodiment, the supporting part 1 includes a supporting platform 11 and a plurality of limiting columns 12 which are movably arranged on the supporting platform 11, the plurality of limiting columns 12 are arranged along edges of the curved backplane 3, and tops of the limiting columns 12 are configured to contact the curved backplane 3, namely, the limiting columns 12 are used for supporting the curved backplane 3. In addition, the positions of the limiting columns 12 on the supporting platform 11 can be adjusted, so that the limiting columns 12 can support a variety of curved backplanes 3 with different sizes.

In the embodiment, the curved backplane 3 includes an edge end face 31, an upper surface 32 fit to the flexible screen 4 and a lower surface 33 back-to-back with the upper surface 32, and the lower surface 33 and the edge end face 31 are in contact with the tops of the limiting columns 12. The top of the limiting column 12 is a L-shaped step, a step surface 121 of the L-shaped step is adapted and fit to a corresponding region of the lower surface 33, and a side face 122 adjacent to the step surface 121 of the L-shaped step is configured to contact the edge end face 31. The step surface 121 on the top of the limiting column 12 can well support the curved backplane 3, and the side face 122 on the top of the limiting column 12 can well limit and fix the curved backplane 3, so that the entire curved backplane 3 can be stably supported and fixed to be well fit to the flexible screen 4 subsequently.

In the embodiment, the supporting part 1 further includes a light source 13; on one side along a width direction of the curved backplane 3 of the supporting platform 11, the light source 13 is arranged on a central position along a length direction of the curved backplane 3 of the supporting platform 11; the light source 13 emits light, a propagation direction of which is perpendicular to the supporting platform 11. The light source 13 is arranged to ensure better alignment when the flexible screen 4 and the curved backplane 3 are fit and assembled subsequently, so as to prevent malposition of the flexible screen 4 and the curved backplane 3 in an assembly process from influencing the quality of the assembled display panel.

In the embodiment, multiple rows of first holes 111 are arranged on the supporting platform 11 along a direction parallel to the width direction of the curved backplane 3, the multiple rows of first holes 111 are spaced from each other, and the first holes 111 are used for fixing the limiting columns 12 supporting a width side of the curved backplane 3. The multiple rows of first holes 111 are arranged to enable the limiting columns 12 to support curved backplanes 3 with different lengths through position adjustment. Multiple rows of second holes 112 are arranged on the supporting platform 11 along a direction parallel to the length direction of the curved backplane 3, the multiple rows of second holes 112 are spaced from each other, and the second holes 112 are used for fixing the limiting columns 12 supporting a length side of the curved backplane 3. The multiple rows of second holes 112 are arranged to enable the limiting columns 12 to support curved backplanes 3 with different widths through position adjustment.

In the embodiment, each row of the first holes 111 includes one or more first strip-shaped holes, and a length direction of the first strip-shaped hole is parallel to the width direction of the curved backplane 3. Due to this arrangement, the position of the limiting column 12 supporting the width side of the curved backplane 3 can be adjusted along the width direction of the curved backplane 3, so that the limiting column 12 supporting the width side of the curved backplane 3 can support the width sides of the curved backplanes 3 with different widths. Each row of the second holes 112 includes one or more second strip-shaped holes, and a length direction of the second strip-shaped hole is parallel to the length direction of the curved backplane 3. Due to this arrangement, the position of the limiting column 12 supporting the length side of the curved backplane 3 can be adjusted along the length direction of the curved backplane 3, so that the limiting column 12 supporting the length side of the curved backplane 3 can support the length sides of the curved backplanes 3 with different lengths.

Since the first holes 111 and the second holes 112 are arranged, positions of the limiting columns 12 on the supporting platform 11 can be adjusted to support and fix the curved backplanes 3 with a variety of different sizes, thereby expanding the assembly range of the assembly equipment and greatly improving the assembly efficiency of the assembly equipment.

It should be noted that the limiting column 12 can also be correspondingly changed according to a bent state of the lower surface 33 of the curved backplane 3, namely, the limiting column 12 with the step surface 121 adapted to the corresponding fitting region of the lower surface 33 is selected according to the bent state of the lower surface 33 of the curved backplane 3. Due to this arrangement, the limiting column 12 can support and fix the curved backplane 3 more stably, so as to facilitate subsequent fitting and assembly of the curved backplane 3 and the flexible screen 4.

Figure 3:
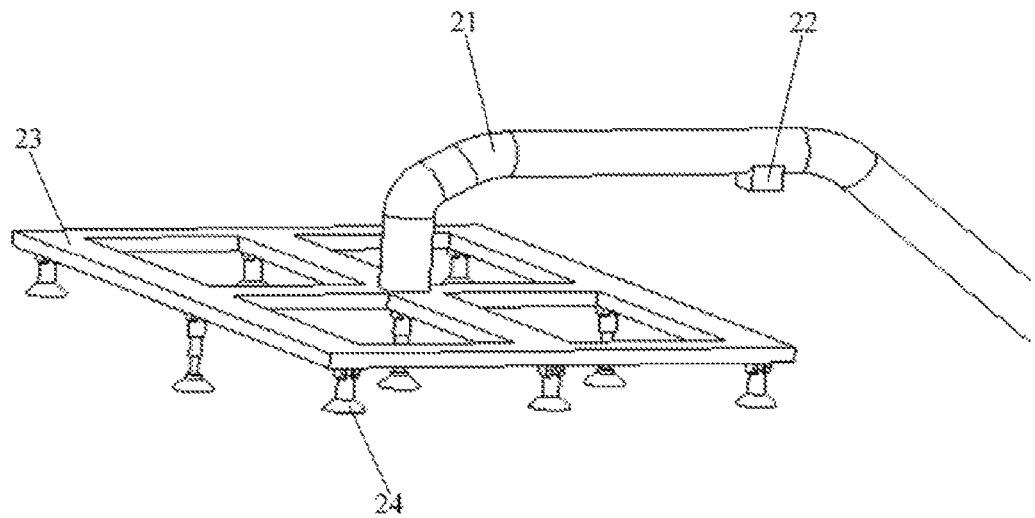
FIG. 3 is a schematic structure diagram of the holding part in FIG. 1.

In the embodiment, as shown in FIGS. 1 and FIG. 3, the holding part 2 includes an expansion link 21, a photosensitive element 22 arranged on the expansion link 21, a plane frame 23 connected to an end part of the expansion link 21 and a plurality of absorption elements 24 arranged on the plane frame 23. The plurality of absorption elements 24 are located on one side facing the supporting platform 11 of the plane frame 23 for adsorbing the flexible screen 4; the photosensitive element 22 is arranged on one side facing the supporting platform 11 of the expansion link 21; and the expansion link 21 is capable of driving the plane frame 23 to move along the length direction and the width direction of the curved backplane 3 and along the direction perpendicular to the supporting platform 11, so that the photosensitive element 22 can receive the light emitted by the light source 13. When the photosensitive element 22 receives the light emitted by the light source 13, the flexible screen 4 adsorbed by the absorption elements 24 and the curved backplane 3 fixed on the limiting column 12 are accurately aligned. The photosensitive element 22 and the light source 13 are arranged to ensure accurate alignment of the flexible screen 4 and the curved backplane 3 in the assembly process, so as to ensure the yield of the assembled display panel.

In the embodiment, three rows of the absorption elements 24 are arranged on the plane frame 23, the three rows of the absorption elements 24 are parallel to and spaced from each other, the absorption elements 24 in the middle row are used for absorbing a center line of the flexible screen 4 along the width direction thereof; and two rows of the absorption elements 24 on both sides are used for absorbing two opposite edges of the flexible screen 4 along the width direction thereof. Due to the arrangement, the flexible screen 4 can be conveniently bent in the assembly process.

In the embodiment, each row of the absorption elements 24 includes a plurality of absorption elements 24, and the plurality of absorption elements 24 are arranged at equal intervals. Due to the arrangement, the flexible screen 4 can be uniformly stressed when being bent, to ensure that the flexible screen 4 can be bent to a shape matched with that of the curved backplane 3.

Figure 4:
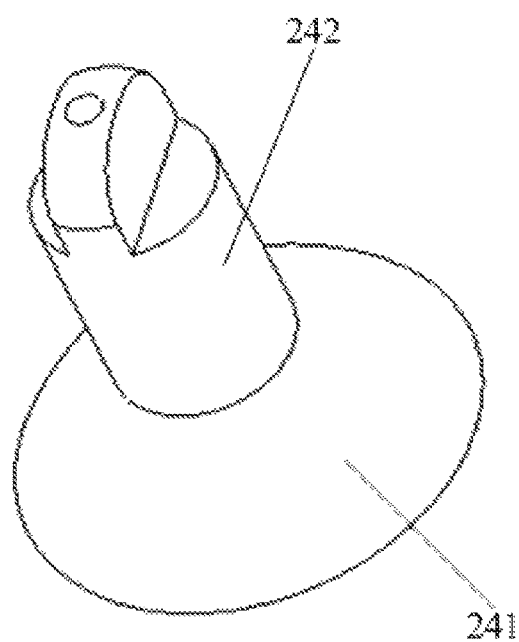
FIG. 4 is a schematic structure diagram of the two rows of adsorption elements on both sides in FIG. 3.
Figure 5:
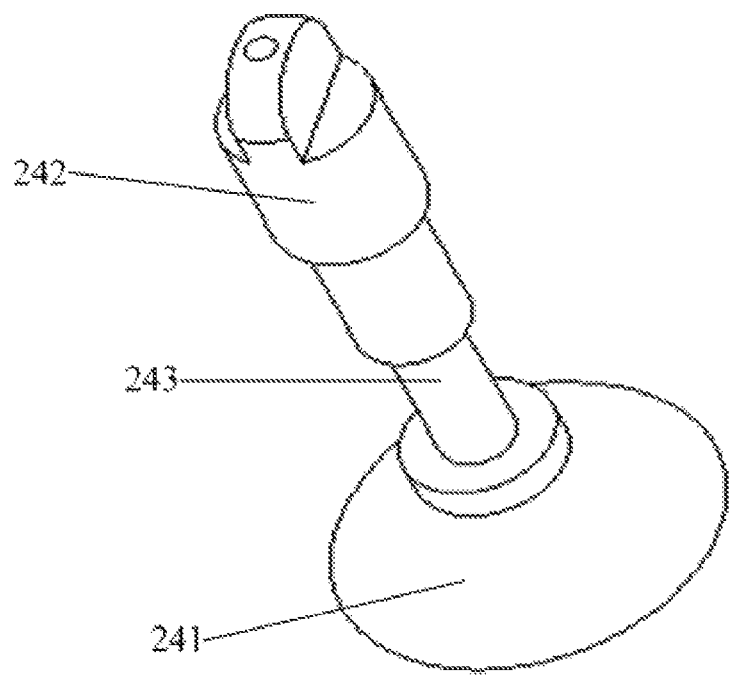
FIG. 5 is a schematic structure diagram of the adsorption elements in a middle row in FIG. 3.

In the embodiment, as shown in FIGS. 4 and 5, each one of the two rows of the absorption elements 24 on both sides includes a suction cup 241 and a connector 242, the suction cup 241 is connected with one end of the connector 242, and the other end of the connector 242 is connected with the plane frame 23. Each one of the absorption elements 24 in the middle row includes a suction cup 241, a telescopic cylinder 243 and a connector 242, the telescopic cylinder 243 is connected between the suction cup 241 and the connector 242, and the connector 242 is connected with the plane frame 23. The suction cup 241 is used for adsorbing the flexible screen 4; and the telescopic cylinder 23 is capable of making telescopic movement under an action of a gas source to change the flexible screen 4 from a planar state into a curved surface state.

It should be noted that the suction cups 241 in the embodiment are plastic suction cups, and the plastic suction cup can firmly adsorb the flexible screen 4 by sucking vacuum and is unlikely to damage the flexible screen 4. Alternatively, the two rows of the absorption elements 24 on both sides can also be provided with telescopic cylinders, as long as the telescopic cylinders of the two rows of the absorption elements 24 on both sides do not act when the flexible screen 4 is bent.

It needs to be additionally noted that the curved backplane 3 can be a backplane including a backlight and an optical film of a liquid crystal panel, and the flexible screen 4 can be a flexible liquid crystal screen; or, the curved backplane can also be a back supporting plate of an electroluminescent device, and the flexible screen 4 can also be a flexible electroluminescent display screen (for example, a flexible organic electroluminescent diode display screen).

Based on the assembly equipment with the above structures, the embodiment further provides an assembly method for assembling the assembly equipment, including: fixing the curved backplane on the supporting part; and holding the flexible screen by the holding part, and assembling the flexible screen with the curved backplane in a fit manner.

Figure 6:
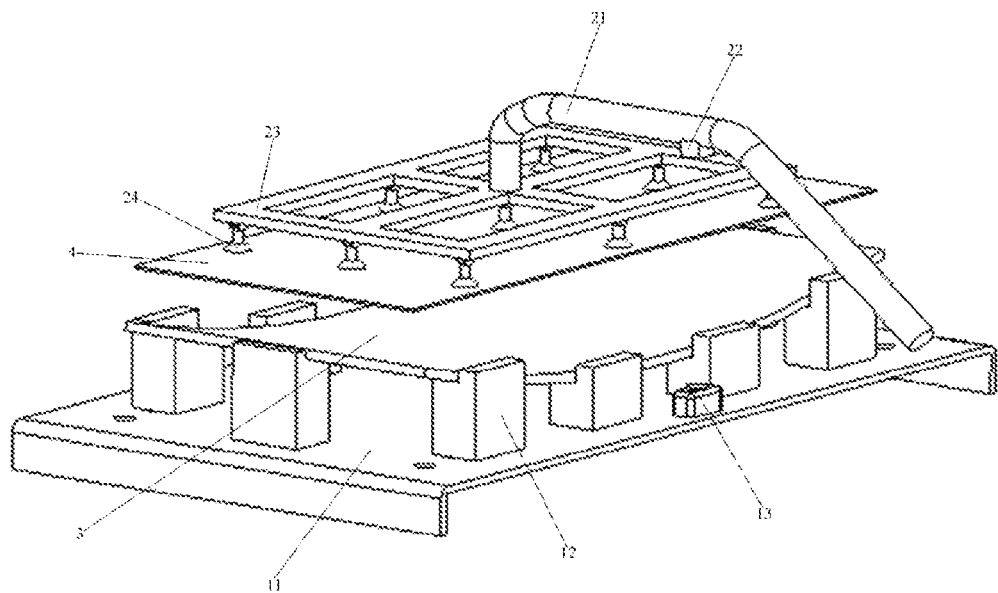
FIG. 6 is a schematic diagram of a step of the adsorption elements adsorbing a flexible screen in a planar state in the assembly method of the assembly equipment.
Figure 7:
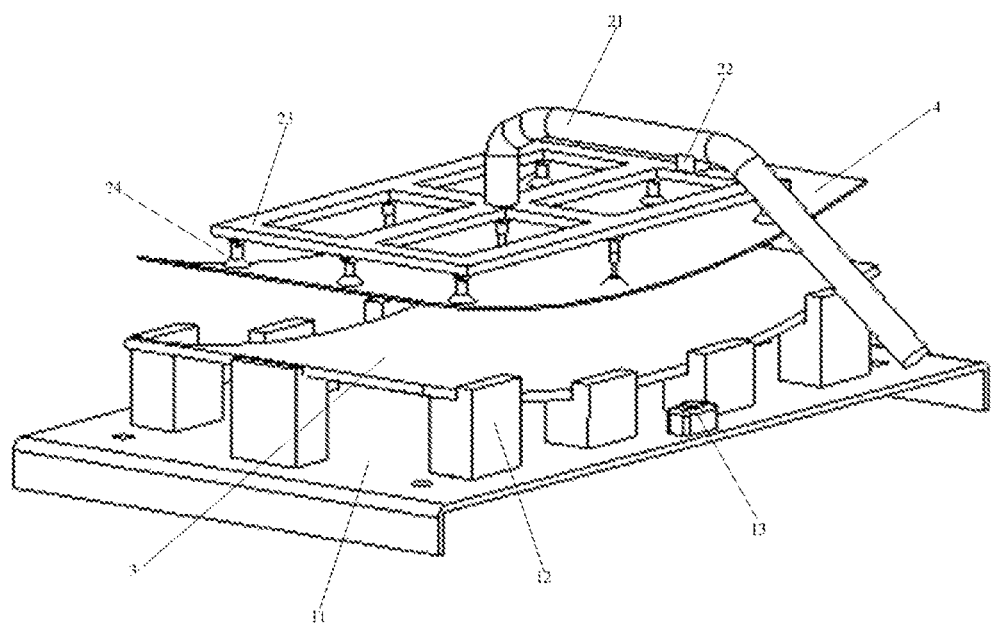
FIG. 7 is a schematic diagram of a step of the adsorption elements changing the flexible screen from the planar state into a curved surface sate in the assembly method of the assembly equipment.

As shown in FIGS. 6 and 7, the assembly method specifically includes:

step S1: adjusting the positions of the limiting columns 12 on the supporting platform 11 according to the size of the curved backplane 3.

step S2: placing the curved backplane 3 on the limiting columns 12.

step S3: adsorbing the flexible screen 4 in the planar state with the adsorption elements 24 in the holding part 2, moving the expansion link 21 in the holding part 2 to adjust a relative position of the flexible screen 4 with respect to the curved backplane 3, until the photosensitive element 22 on the expansion link 21 receives the light emitted by the light source 13 on the supporting platform 11.

step S4: expanding the telescopic cylinders 243 of the adsorption elements 24 in the middle row to change the flexible screen 4 from the planar state into the curved surface state, and adapting the flexible screen 4 in the curved surface state to the shape of the curved backplane 3.

step S5: driving the flexible screen 4 with the expansion link 21 to move towards the curved backplane 3 along the direction perpendicular to the supporting platform 11, until the flexible screen 4 is fit to the curved backplane 3.

So far, the flexible screen 4 and the curved backplane 3 are assembled.

Second Embodiment

Figure 8:
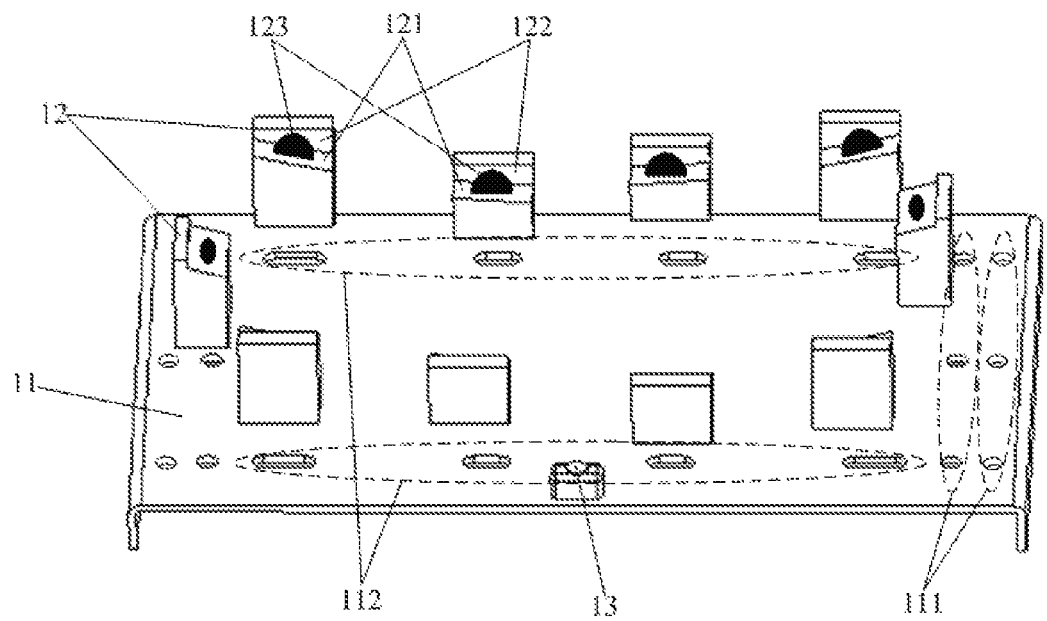
FIG. 8 is a schematic structure diagram of a supporting part according to the second embodiment of the present invention.

As shown in FIG. 8, just like in the first embodiment, the curved backplane includes an edge end face, an upper surface fit to the flexible screen and a lower surface back-to-back with the upper surface, and the lower surface and the edge end face are in contact with the tops of the limiting columns. The top of the limiting column 12 is a L-shaped step, and different from the first embodiment, a supporting ball 123 capable of rotating 360° is embedded on a step surface 121 of the L-shaped step, an exposed top of the supporting ball 123 is higher than the step surface 121, and the supporting ball 123 is configured to contact a corresponding point on the lower surface; and a side face 122 adjacent to the step surface 121 of the L-shaped step is configured to contact the edge end face. A unidirectional elastic mechanism (not shown) is arranged below the supporting ball 123, and the unidirectional elastic mechanism enables the supporting ball 123 to approach or depart from the supporting platform 11 along a direction perpendicular to the supporting platform 11.

Due to this arrangement, the limiting column 12 only forms point contact with the lower surface of the curved backplane, and the unidirectional elastic mechanism is configured such that after the curved backplane is fixed on the limiting column 12 and in an assembly process of the curved backplane and the flexible screen, the curved backplane can only move along a direction approaching the supporting platform 11 under the action of the gravity thereof and under a press-fit action of the flexible screen; compared with the limiting column 12 in the first embodiment, the above configuration can reduce the influence of the limiting columns 12 on the curvature of the curved backplane, thereby guaranteeing that the flexible screen can be accurately fit to and assembled with the curved backplane.

It should be noted that, for example, in the case that the curved backplane is bent along the length direction thereof instead of bent along the width direction thereof, the following configuration can also be adopted: the limiting column used for supporting the width side of the curved backplane adopts the structure of the limiting column in the first embodiment, and the limiting column used for supporting the length side of the curved backplane adopts the structure of the limiting column in this embodiment. In this way, not only can stable fixation of the curved backplane by the limiting column be guaranteed, but also the influence of the limiting columns on the curvature of the curved backplane can be reduced, thereby guaranteeing that the flexible screen can be accurately fit to and assembled with the curved backplane.

Other structures of the assembly equipment and the assembly method thereof in the embodiment are the same as those in the first embodiment, and thus will not be repeated redundantly herein.

It should be understood that the above embodiments are merely exemplary embodiments for the purpose of illustrating the principle of the disclosure, and the disclosure is not limited thereto. Various modifications and improvements can be made by a person having ordinary skill in the art without departing from the spirit and essence of the disclosure. Accordingly, all of the modifications and improvements also fall into the protection scope of the disclosure.

The invention claimed is:

1. An assembly equipment for assembling a flexible screen with a curved backplane, comprising:
   a supporting part used for supporting and fixing the curved backplane; and
   a holding part used for holding the flexible screen and assembling the flexible screen with the curved backplane in a fit manner.

2. The assembly equipment of claim 1,
   wherein the supporting part comprises a supporting platform and a plurality of limiting columns which are movably arranged on the supporting platform, the plurality of limiting columns are arranged along edges of the curved backplane, and tops of the limiting columns are configured to contact the curved backplane.

3. The assembly equipment of claim 2,
   wherein the curved backplane comprises an edge end face, an upper surface fit to the flexible screen and a lower surface back-to-back with the upper surface, and the lower surface and the edge end face are in contact with the tops of the limiting columns; and
   the top of the limiting column is a L-shaped step, a step surface of the L-shaped step is adapted and fit to a corresponding region of the lower surface, and a side face adjacent to the step surface of the L-shaped step is configured to contact the edge end face.

4. The assembly equipment of claim 2,
   wherein the curved backplane comprises an edge end face, an upper surface fit to the flexible screen and a lower surface back-to-back with the upper surface, and the lower surface and the edge end face are in contact with the tops of the limiting columns;
   the top of the limiting column is a L-shaped step, a supporting ball capable of rotating 360° is embedded on a step surface of the L-shaped step, an exposed top of the supporting ball is higher than the step surface, and the supporting ball is configured. to contact a corresponding point on the lower surface; a side face adjacent to the step surface of the L-shaped step is configured to contact the edge end face; and
   a unidirectional elastic mechanism is arranged below the supporting ball, and the unidirectional elastic mechanism enables the supporting ball to approach or depart from the supporting platform along a direction perpendicular to the supporting platform.

5. The assembly equipment of claim 2,
   wherein the supporting part further comprises a light source; on one side along a width direction of the curved backplane of the supporting platform, the light source is arranged on a central position along a length direction of the curved backplane of the supporting platform; and the light source emits light, a propagation direction of which is perpendicular to the supporting platform.

6. The assembly equipment of claim 2,
   wherein multiple rows of first holes are arranged on the supporting platform along a direction parallel to the width direction of the curved backplane, the multiple rows of first holes are spaced from each other, and the first holes are used for fixing the limiting columns supporting a width side of the curved backplane; and
   multiple rows of second holes are arranged on the supporting platform along a direction parallel to the length direction of the curved backplane, the multiple rows of second holes are spaced from each other, and the second holes are used for fixing the limiting columns supporting a length side of the curved backplane.

7. The assembly equipment of claim 6,
   wherein each row of the first holes comprises one or more first strip-shaped holes, and a length direction of the first strip-shaped hole is parallel to the width direction of the curved backplane; and
   each row of the second holes comprises one or more second strip-shaped holes, and a length direction of the second strip-shaped hole is parallel to the length direction of the curved backplane.

8. The assembly equipment of claim 5,
   wherein the holding part comprises an expansion link, a photosensitive element arranged on the expansion link, a plane frame connected to an end part of the expansion link and a plurality of absorption elements arranged on the plane frame; and
   the plurality of absorption elements are located on one side facing the supporting platform of the plane frame for adsorbing the flexible screen; the photosensitive element is arranged on one side facing the supporting platform of the expansion link; and the expansion link is capable of driving the plane frame to move along the length direction and the width direction of the curved backplane and along the direction perpendicular to the supporting platform, to enable the photosensitive element to receive the light emitted by the light source.

9. The assembly equipment of claim 8,
wherein three rows of the absorption elements are arranged on the plane frame, the three rows of the absorption elements are parallel to and spaced from each other, the absorption elements in the middle row are used for absorbing a center line of the flexible screen along the width direction thereof, and two rows of the absorption elements on both sides are used for absorbing two opposite edges of the flexible screen along the width direction thereof.

10. The assembly equipment of claim 9,
wherein each row of the absorption elements comprises a plurality of absorption elements, and the plurality of absorption elements are arranged at equal intervals.

11. The assembly equipment of claim 10,
wherein each one of the two rows of the absorption elements on both sides includes a suction cup and a connector, the suction cup is connected with one end of the connector, and the other end of the connector is connected with the plane frame;
each one of the absorption elements in the middle row includes a suction cup, a telescopic cylinder and a connector, the telescopic cylinder is connected between the suction cup and the connector, and the connector is connected with the plane frame; and
the suction cup is used for adsorbing the flexible screen; and the telescopic cylinder is capable of making telescopic movement under an action of a gas source to change the flexible screen from a planar state into a curved surface state.

12. An assembly method for assembling the assembly equipment of claim 1, comprising
fixing the curved backplane on the supporting part; and
holding the flexible screen by the holding part, and assembling the flexible screen with the curved backplane in a fit manner.

13. The assembly method of claim 12, specifically comprising:
adjusting the positions of the limiting columns on the supporting platform according to the size of the curved backplane;
placing the curved backplane on the limiting columns;
adsorbing the flexible screen in the planar state with the adsorption elements in the holding part, moving the expansion link in the holding part to adjust a relative position of the flexible screen with respect to the curved backplane, until the photosensitive element on the expansion link receives the light emitted by the light source on the supporting platform;
expanding and contracting the telescopic cylinders of the adsorption elements in the middle row to change the flexible screen from the planar state into the curved surface state, and adapting the flexible screen in the curved surface state to the shape of the curved backplane; and
driving the flexible screen with the expansion link to move towards the curved backplane along the direction perpendicular to the supporting platform, until the flexible screen is fit to the curved backplane.

* * * * *